United States Patent
Uno et al.

(10) Patent No.: US 10,158,082 B2
(45) Date of Patent: Dec. 18, 2018

(54) SEMICONDUCTING COMPONENT FOR ELECTROGRAPHIC DEVICE

(71) Applicant: Osaka Soda Co., Ltd., Osaka (JP)

(72) Inventors: Kazuki Uno, Osaka (JP); Kohji Ohnuki, Osaka (JP); Shinichi Udo, Osaka (JP); Yoritaka Yasuda, Osaka (JP)

(73) Assignee: OSAKA SODA CO., LTD., Osaka (JP)

( * ) Notice: Subject to any disclaimer, the term of this patent is extended or adjusted under 35 U.S.C. 154(b) by 225 days.

(21) Appl. No.: 14/917,982

(22) PCT Filed: Oct. 14, 2014

(86) PCT No.: PCT/JP2014/077324
§ 371 (c)(1),
(2) Date: Mar. 10, 2016

(87) PCT Pub. No.: WO2015/056670
PCT Pub. Date: Apr. 23, 2015

(65) Prior Publication Data
US 2016/0225997 A1 Aug. 4, 2016

(30) Foreign Application Priority Data

Oct. 15, 2013 (JP) ................................. 2013-214338

(51) Int. Cl.
| | |
|---|---|
| H01L 51/00 | (2006.01) |
| G03G 15/00 | (2006.01) |
| C08G 59/02 | (2006.01) |
| G03G 15/02 | (2006.01) |
| G03G 15/08 | (2006.01) |
| G03G 15/16 | (2006.01) |

(52) U.S. Cl.
CPC .......... *H01L 51/0043* (2013.01); *C08G 59/02* (2013.01); *G03G 15/00* (2013.01); *G03G 15/0233* (2013.01); *G03G 15/0818* (2013.01); *G03G 15/1685* (2013.01)

(58) Field of Classification Search
CPC .... C08G 59/02; H01L 51/0043; G03G 15/00; G03G 15/0233; G03G 15/0818; G03G 15/1685

USPC ........................................................ 428/413
See application file for complete search history.

(56) References Cited

FOREIGN PATENT DOCUMENTS

| | | |
|---|---|---|
| EP | 2 985 658 A1 | 2/2016 |
| JP | H 06 208289 A | 7/1994 |
| JP | 2002 038001 A | 2/2002 |
| JP | 2004 182786 A | 7/2004 |
| JP | 2004 204968 A | 7/2004 |
| JP | 2011 032339 A | 2/2011 |
| JP | 2012-036289 A | 2/2012 |
| WO | WO 2014/157045 A1 | 10/2014 |

OTHER PUBLICATIONS

Nishimura et al., JP 2002-038001 A machine translation in English, Feb. 6, 2002 (Year: 2002).*
International Search Report and Written Opinion Application No. PCT/JP2014/077324 dated Jan. 20, 2015.
Office Action from corresponding Korean Patent Application No. 10-2016-7005882, dated Aug. 24, 2017, 9 pages.
International Preliminary Report on Patentability for Application No. PCT/JP2014/077324 dated Apr. 19, 2016.
Office Action from corresponding Japanese Patent Application No. 2015-542613, dated May 18, 2017, 7 pages.
Office Action from corresponding Chinese Patent Application No. 201480049393.3 dated Dec. 5, 2017, 14 pages.
Office Action for Chinese Patent Application No. 201480049393.3 dated Aug. 10, 2018.

* cited by examiner

*Primary Examiner* — David T Karst
(74) *Attorney, Agent, or Firm* — Alston & Bird LLP

(57) ABSTRACT

A semiconducting component for an electrographic device, comprising a crosslinked body obtained by crosslinking a copolymer containing 9.9 to 39.9% by mole of structural units (a) originating from an epihalohydrin, 60 to 90% by mole of structural units (b) originating from an alkylene oxide, and 0.1 to 10% by mole of structural units (c) originating from a cyclic ether monomer having a (meth) acryloyl or alkoxysilyl group with use of reactivity of the structural units originating from the cyclic ether monomer having a (meth)acryloyl or alkoxysilyl group.

18 Claims, No Drawings

SEMICONDUCTING COMPONENT FOR ELECTROGRAPHIC DEVICE

TECHNICAL FIELD

The present invention relates to a semiconducting component for an electrographic device. The semiconducting component for an electrographic device of the invention is useful as a semiconducting roll or belt for electrification, development, transferring and others in an electrographic process in a copying machine, a printer or some other.

BACKGROUND ART

In recent years, an electrifying roll, a transferring roll and a developing roll used in a contact electrifying manner have been required to be components coping with an improvement in image quality and operating speed.

Usually, the electrifying roll, the transferring roll and the developing roll need to have, as an electrical property thereof, semi-conductivity. Moreover, these rolls contact a photosensitive body, so that the rolls are desired not to break the photosensitive body easily and also desired to be small in property of contaminating the photosensitive body. Thus, components which use, as a material thereof, a rubbery material are used in many cases.

As a material of the electrifying roll and others, an epichlorohydrin based polymer, which is a semiconducting rubber, is widely used at present because of the electroconductive property thereof. A method for crosslinking the epichlorohydrin based polymer is generally a method of adding, to a monomer therefor, a crosslinking agent and a crosslinking promoter, and then heating the resultant. However, it is known that in the crosslinking method using a crosslinking agent, residues of the added crosslinking agent contaminate the photosensitive body by heat generated at the time of the crosslinking (see Patent Document 1).

Thus, as a material used for electrographic devices such as an electroconductive roll, a material is desired which has semi-conductivity and is small in property of contaminating a photosensitive body.

PRIOR ART DOCUMENT

Patent Document

Patent Document 1: JP-A-H06-208289

SUMMARY OF THE INVENTION

Problems to be Solved by the Invention

The present invention has been made in light of such situations, and an object thereof is to provide a semiconducting component for an electrographic device remarkably decreased in property of contaminating a photosensitive body and others, this component being a component used in a semiconducting roll and a semiconducting belt for electrification, development, transferring or some other in an electrographic process used in copying machines, printers and others.

Means for Solving the Problems

The inventors have found out that the use amount of a crosslinking agent and others that cause contaminations onto a photosensitive body and others is remarkably decreased by use of a semiconducting component for an electrographic device comprising a crosslinked body obtained by crosslinking a copolymer containing 9.9 to 39.9% by mole of structural units (a) originating from an epihalohydrin, 60 to 90% by mole of structural units (b) originating from an alkylene oxide, and 0.1 to 10% by mole of structural units (c) originating from a cyclic ether monomer having a (meth)acryloyl or alkoxysilyl group with use of reactivity of the structural units originating from the cyclic ether monomer having a (meth)acryloyl or alkoxysilyl group. The inventors have also found out that the decrease solves the above-mentioned problems to achieve the present invention.

Item 1: A semiconducting component for an electrographic device, comprising a crosslinked body obtained by crosslinking a copolymer containing 9.9 to 39.9% by mole of structural units (a) originating from an epihalohydrin, 60 to 90% by mole of structural units (b) originating from an alkylene oxide, and 0.1 to 10% by mole of structural units (c) originating from a cyclic ether monomer having a (meth)acryloyl or alkoxysilyl group with use of reactivity of the structural units originating from the cyclic ether monomer having a (meth)acryloyl or alkoxysilyl group.

Item 2: The semiconducting component for an electrographic device according to item 1, wherein the structural units (c) originating from the cyclic ether monomer having a (meth)acryloyl or alkoxysilyl group are each a structural unit originating from at least one selected from the group consisting of glycidyl acrylate, glycidyl methacrylate, 3-glycidoxypropyltrimethoxysilane, and 3-glycidoxypropylmethyldimethoxysilane.

Item 3: The semiconducting component for an electrographic device according to item 1 or 2, wherein the structural units (a) originating from the epihalohydrin are each a structural unit originating from at least one selected from the group consisting of epichlorohydrin and epibromohydrin.

Item 4: The semiconducting component for an electrographic device according to any one of items 1 to 3, wherein the structural units (b) originating from the alkylene oxide are each a structural unit originating from at least one selected from the group consisting of ethylene oxide, propylene oxide and butylene oxide.

Item 5: The semiconducting component for an electrographic device according to any one of items 1 to 4, wherein the crosslinked body has a hardness of 10 to 80 in a hardness test according to type A in JIS K6253.

Item 6: The semiconducting component for an electrographic device according to any one of items 1 to 5, which is a semiconducting roll in which the crosslinked body is stacked on a substrate, the crosslinked body being a crosslinked body obtained by crosslinking the copolymer containing 9.9 to 39.9 by mole of the structural units (a) originating from the epihalohydrin, 60 to 90% by mole of the structural units (b) originating from the alkylene oxide, and 0.1 to 10% by mole of the structural units (c) originating from the cyclic ether monomer having a (meth)acryloyl or alkoxysilyl group with the use of the reactivity of the structural units originating from the cyclic ether monomer having a (meth)acryloyl or alkoxysilyl group.

Item 7: An electrographic device comprising the semiconducting component for an electrographic device according to any one of items 1 to 6.

Effect of the Invention

The semiconducting component for an electrographic device obtained according to the present invention not only has semi-conductivity similar to components that have been hitherto used in electrifying rolls, developing rolls, transferring rolls or others but also has remarkably small property of contaminating a photosensitive body, so that the semiconducting component for an electrographic device is greatly useful for a semiconducting roll, a belt and some other component in a copying machine, a printer and others.

MODE FOR CARRYING OUT THE INVENTION

Hereinafter, the present invention will be described in detail.

The semiconducting component for an electrographic device of the present invention comprises a crosslinked body obtained by crosslinking a copolymer containing 9.9 to 39.9% by mole of structural units (a) originating from an epihalohydrin, 60 to 90% by mole of structural units (b) originating from an alkylene oxide, and 0.1 to 10% by mole of structural units (c) originating from a cyclic ether monomer having a (meth)acryloyl or alkoxysilyl group with the use of the reactivity of the structural units originating from the cyclic ether monomer having a (meth)acryloyl or alkoxysilyl group.

In the copolymer for the present invention, the structural units (a) originating from the epihalohydrin are each preferably a structural unit originating from at least one selected from the group consisting of epichlorohydrin and epibromohydrin, more preferably a structural unit originating from epichlorohydrin.

In the copolymer for the present invention, the structural units (a) originating from the epihalohydrin has a proportion preferably from 9.9 to 39.9% by mole, more preferably from 9.9 to 34.5% by mole, in particular preferably from 9.9 to 29.5% by mole.

In the copolymer for the present invention, the structural units (b) originating from the alkylene oxide are each preferably a structural unit originating from at least one selected from the group consisting of ethylene oxide, propylene oxide and butylene oxide. From the viewpoint of semi-conductivity, the units are each in particular preferably a structural unit originating from ethylene oxide.

In the copolymer for the present invention, the structural units (b) originating from the alkylene oxide has a proportion preferably from 60 to 90% by mole, more preferably from 60 to 80% by mole, in particular preferably from 65 to 80% by mole.

In the copolymer for the present invention, the structural units (c) originating from the cyclic ether monomer having a (meth)acryloyl or alkoxysilyl group are each preferably a structural unit originating from at least one selected from the group consisting of glycidyl acrylate, glycidyl methacrylate, 3-glycidoxypropyltrimethoxysilane, and 3-glycidoxypropylmethyldimethoxysilane, more preferably a structural unit originating from glycidyl methacrylate and/or 3-glycidoxypropyltrimethoxysilane. The (meth)acryloyl group means an acryloyl group and/or a methacryloyl group.

In the copolymer for the present invention, the structural units (c) originating from the cyclic ether monomer having a (meth)acryloyl or alkoxysilyl group has a proportion preferably from 0.1 to 10% by mole, more preferably from 0.1 to 8% by mole, in particular preferably from 1 to 8% by mole.

The crosslinked body in the present invention is obtained by crosslinking a copolymer containing the structural units (a) originating from the epihalohydrin, the structural units (b) originating from the alkylene oxide, and the structural units (c) originating from the cyclic ether monomer having a (meth)acryloyl or alkoxysilyl group with the use of the reactivity of the structural units originating from the cyclic ether monomer having a (meth)acryloyl or alkoxysilyl group. In short, the copolymer can be crosslinked without using any crosslinking agent, which causes contaminating property. Thus, a finally obtained semiconducting component for an electrographic device can be small in property of contaminating a photosensitive body and others. When the crosslinked body is produced which constitutes the semiconducting component for an electrographic device according to the present invention, a crosslinking agent used usually for crosslinking an epichlorohydrin based polymer, for example, a polyamine crosslinking agent, a quinoxaline type crosslinking agent, a thiourea type crosslinking agent, a triazine type crosslinking agent, a bisphenolic crosslinking agent, a sulfur-containing crosslinking agent, or a peroxide crosslinking agent, can be used in combination in addition of the crosslinking of the component (c). As described above, however, when any component that constitutes the semiconducting component for an electrographic device contains a crosslinking agent, the crosslinking agent may unfavorably contaminate a photosensitive body and others; thus, when the total proportion of the copolymer is regarded as 100% by weight, the blend proportion of the crosslinking agent is preferably 3% by weight or less, more preferably 1% by weight or less, even more preferably less than 0.1% by weight. It is particularly preferred not to use any crosslinking agent.

Examples of the polyamine crosslinking agent include ethylenediamine, hexamethylenediamine, diethylenetriamine, triethylenetetramine, hexamethylenetetramine, p-phenylenediamine, cumenediamine, N,N'-dicinnamilidene-1,6-hexanediamine, ethylenediamine carbamate, and hexamethylenediamine carbamate.

Examples of the quinoxaline type crosslinking agent include 2,3-dimercaptoquinoxaline, quinoxaline-2,3-dithiocarbonate, 6-methylquinoxaline-2,3-dithiocarbonate, and 5,8-dimethylquinoxaline-2,3-dithiocarbonate.

Examples of the thiourea type crosslinking agent include 2-mercaptoimidazoline, 1,3-diethylthiourea, 1,3-dibutylthiourea, and trimethylthiourea.

Examples of the triazine type crosslinking agent include 2,4,6-trimercapto-1,3,5-triazine, 2-hexylamino-4,6-dimercaptotriazine, 2-diethylamino-4,6-dimercaptotriazine, 2-cyclohexylamino-4,6-dimercaptotriazine, 2-dibutylamino-4,6-dimercaptotriazine, 2-anilino-4,6-dimercaptotriazine, and 2-phenylamino-4,6-dimercaptotriazine.

Examples of the bisphenolic crosslinking agent include bisphenol AF and bisphenol S.

Examples of the sulfur-containing crosslinking agent include sulfur, and active sulfur releasing-type compounds such as tetramethylthiuram monosulfide, tetramethylthiuram disulfide, tetraethylthiuram disulfide, tetrabutylthiuram monosulfide, tetrabutylthiuram disulfide, N,N'-dimethyl-N,N'-diphenylthiuram disulfide, dipentamethylenethiuram monosulfide, dipentamethylenethiuram disulfide, dipentamethylenethiuram tetrasulfide, and dipentamethylenethiuram hexasulfide.

Examples of the peroxide crosslinking agent include tert-butyl hydroperoxide, p-menthane hydroperoxide, dicumyl peroxide, tert-butyl peroxide, 1,3-bis(tert-butylperoxyisopropyl)benzene, 2,5-dimethyl-2,5-di(tert-butylperoxy)hexane, benzoyl peroxide, and tert-butyl peroxybenzoate.

The crosslinked body for the present invention is crosslinked preferably using heat, or active energy rays such as ultraviolet rays or electron rays when the crosslinking is attained using the (meth)acryloyl group in the copolymer. In the case of the crosslinking with heat, crosslinking reaction is finished in a period of 3 minutes to 5 hours under a condition of a temperature of 100° C. to 200° C. In the case of using active energy rays such as ultraviolet rays or electron rays, a sensitizer is generally used. Usually, crosslinking reaction is finished in a period of 0.1 seconds to 1 hour under a condition of a temperature of 10° C. to 150° C.

In the crosslinked body for the present invention, the crosslinking is attained preferably using heat or steam when the alkoxysilyl group is used to attain the crosslinking. In the case of the crosslinking with heat, crosslinking reaction is finished in a period of 3 minutes to 1 hour under a condition of a temperature of 100° C. to 200° C. In the case of the crosslinking with steam, crosslinking reaction is finished in a period of 5 minutes to 1 hour.

The semiconducting component for an electrographic device of the present invention may contain an acid acceptor usable at the time of crosslinking the copolymer containing the structural units (a) originating from the epihalohydrin, the structural units (b) originating from the alkylene oxide, and the structural units (c) originating from the cyclic ether monomer having a (meth)acryloyl or alkoxysilyl group.

The acid acceptor used in the present invention may be a known acid acceptor, and is preferably a metal compound and/or an inorganic microporous crystal. Examples of the metal compound include oxides, hydroxides, carbonates, carboxylates, silicates, borates, and phosphites of any metal in Group II (Groups 2 and 12) in the periodic table; oxides, hydroxides, carboxylates, silicates, sulfates, nitrates, and phosphates of any metal in Group III (Groups 3 and 13) in the periodic table; and oxides, basic carbonates, basic carboxylates, basic phosphites, basic sulfites, and tribasic sulfates of any metal in Group IV (Groups 4 and 14) in the periodic table.

Specific examples of the metal compounds include magnesia, magnesium hydroxide, aluminum hydroxide, barium hydroxide, sodium carbonate, magnesium carbonate, barium carbonate, quicklime, slaked lime, calcium carbonate, calcium silicate, calcium stearate, zinc stearate, calcium phthalate, calcium phosphite, zinc flower, tin oxide, lead monoxide, red lead, white lead, dibasic lead phthalate, dibasic lead carbonate, tin stearate, basic lead phosphite, basic tin phosphite, basic lead sulfite, and tribasic lead sulfate. Preferred are sodium carbonate, magnesia, magnesium hydroxide, quicklime, slaked lime, calcium silicate, and zinc flower.

The inorganic microporous crystal denotes a crystalline porous body, and can be distinguished from any amorphous porous body, such as silica gel or alumina. Examples of the inorganic microporous crystal include zeolites, aluminophosphate type molecular sieves, lamellar silicates, synthetic hydrotalcite, and alkali metal titanates. The acid acceptor is in particular preferably synthetic hydrotalcite.

The zeolites are, in addition to natural zeolite, A-type, X-type and Y-type synthetic zeolites, sodalites, natural and synthetic mordenites, ZSM-5 and other various zeolites; and metal-substituted products of these zeolites. These may be used singly or in any combination of two or more thereof. The metal of the metal-substituted products is sodium in many cases. The zeolites are preferably zeolites large in acid receiving capability, and A-type zeolite is preferred.

The above-mentioned synthetic hydrotalcite is represented by the following general formula (1):

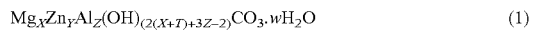

$$Mg_XZn_YAl_Z(OH)_{(2(X+Y)+3Z-2)}CO_3 \cdot wH_2O \qquad (1)$$

wherein x's and y's each represent an actual number from 1 to 10 provided that "x+y=1 to 10" is satisfied; z's each represent an actual number from 1 to 5; and w represents an actual number from 0 to 10.

Examples of the hydrotalcite represented by the general formula (1) include $Mg_{4.5}Al_2(OH)_{13}CO_3 \cdot 3.5H_2O$, $Mg_{4.5}Al_2(OH)_{13}CO_3$, $Mg_4Al_2(OH)_{12}CO_3 \cdot 3.5H_2O$, $Mg_6Al_2(OH)_{16}CO_3 \cdot 4H_2O$, $Mg_5Al_2(OH)_{14}CO_3 \cdot 4H_2O$, $Mg_3Al_2(OH)_{10}CO_3 \cdot 1.7H_2O$, $Mg_3ZnAl_2(OH)_{12}CO_3 \cdot 5H_2O$, and $Mg_3ZnAl_2(OH)_{12}CO_3$.

The semiconducting component for an electrographic device of the present invention may contain an anti-aging agent. The anti-aging agent may be a known anti-aging agent. Examples of the anti-aging agent include phenyl-α-naphthylamine, p-toluenesulfonylamide-diphenylamine, 4,4-α,α-dimethylbenzyldiphenylamine, a high-temperature reaction product of diphenylamine and acetone, a low-temperature reaction product of diphenylamine and acetone, a low-temperature reaction product of diphenylamine, aniline and acetone, a reaction product of diphenylamine and diisobutylene, octylated diphenylamine, substituted diphenylamine, alkylated diphenylamine, diphenylamine derivatives, N,N'-diphenyl-p-phenylenediamine, N-isopropyl-N'-phenyl-p-phenylenediamine, N,N'-di-2-naphthyl-p-phenylenediamine, N-phenyl-N'-3-methacryloyloxy-2-hydroxypropyl-p-phenylenediamine, N,N'-bis 1-methylheptyl-p-phenylenediamine, N,N'-bis 1,4-dimethylpentyl-p-phenylenediamine, N-1,3-dimethylbutyl-N'-phenyl-p-phenylenediamine, a mixture product of dially-p-phenylenediamine, phenyl, octyl-p-phenylenediamine, a mixture product of phenyl-α-naphthylamine and diphenyl-p-phenylenediamine, a polymer of 2,2,4-trimethyl-1,2 dihydroquinoline, 6-ethoxy-2,2,4-trimethyl-1,2-dihydroquinoline, 2,5-di-tert-amylhydroquinone, 2,5-di-tert-butylhydroquinone, 1-oxy-3-methyl-4-isopropylbenzene, 2,6-di-tert-butyl-4-ethylphenol, butylhydroxyanisole, 2,6-di-tert-butyl-α-dimethylamino-p-cresol, a mixture product of 2,6-di-tert-butylphenol, 2,4,6-tri-tert-butylphenol and ortho-tert-butylphenol, styrenated phenol, alkylated phenol, a mixture product of alkyl- and aralkyl-substituted phenols, phenol derivatives, 2,2'-methylene-bis-4-methyl-6-tert-butylphenol, 2,2'-methylene-bis-4-methyl-6-cyclohexylphenol, 2,2'-methylene-bis-4-ethyl-6-tert-butylphenol, 4,4-methylene-bis-2,6-di-tert-butylphenol, methylene-crosslinked polyvalent alkylphenol, alkylated bisphenol, a butylated reaction product of p-cresol and dicyclopentadiene, a mixture of polybutylated bisphenol A, 4,4-thiobis-6-tert-butyl-3-methylphenol, 4,4-butylidenebis-3-methyl-6-tert-butylphenol, 2,4-bisoctylthiomethyl-O-cresol, hindered phenol, hindered bisphenol, 2-mercaptobenzimidaole, 2-mercaptomethylbenzimidazole, a zinc salt of 2-mercaptobenzimidazole, a zinc salt of 2-mercaptomethylbenzimidazole, 4- and 5-mercaptomethylbenzimidazoles, zinc salts of 4- and 5-mercaptomethylbenzimidazoles, dioctadecyl disulfide, nickel diethyldithiocarbamate, nickel dibutyldithiocarbamate, 1,3-bisdimethylaminopropyl-2-thiourea, tributylthiourea, bis 2-methyl-4-3-n-alkylthiopropionyloxy-5-tert-butylphenyl sulfide, bis 3,5-di-tert-butyl-4-hydroxybenzyl sulfide, mixed lauryl and stearyl thiodipropionates, cyclic acetal, a mixture product of 60% polymer polyol and 40% hydrogenated silica, an especial polyethylene glycol processed product having a two-molecule structure of polyethylene and polyethylene glycol, an especial designed mixture product of an inactive filler and polymer polyol, a composite anti-aging agent, enol ether, 1,2,3-benzotriazole, 3-N-salicyloylamino-1,2,4-triazole, a triazine type derivative composite, disalicyloylhydrazide decamethylenecarbonate, N,N'-bis 3-3,5-di-tert-4-hydroxyphenylpropionylhydrazine, and tetrakis-methylene-3-3',5'-di-tert-butyl 4' hydroxyphenylpropionate methane.

As far as the effects of the present invention are not impaired, a blending agent may be optionally bended into the semiconducting component for an electrographic device of the invention in addition to those described above. Example of the blending agents include various fillers, reinforcing agents, plasticizers, electroconductive agents, processing aids, flame retardants, pigments, crosslinking agents, and crosslinking promoters that are used in the present technical field. Furthermore, as far as properties of the invention are not lost, blending of any other rubber or resin may be performed, the blending being usually performed in the technical field.

The blending of the blending agent, the other rubber or resin can be attained by kneading this material together with the copolymer containing 9.9 to 39.9 by mole of the structural units (a) originating from the epihalohydrin, 60 to 90% by mole of the structural units (b) originating from the alkylene oxide, and 0.1 to 10% by mole of the structural units (c) originating from the cyclic ether monomer having a (meth)acryloyl or alkoxysilyl group. By crosslinking a composition obtained by the kneading, which contains the copolymer and the blending agent, a crosslinked body can be obtained. The resultant is usable as a semiconducting component for an electrographic device that contains the crosslinked body.

In the method for the kneading for producing the semiconducting component for an electrographic device of the present invention, any means that has been hitherto used in the field of polymer processing is usable. Examples thereof include a mixing roll, a Bunbury mixer, and various kneaders.

Examples of the method for shaping the semiconducting component for an electrographic device of the present invention include compression molding using a mold, extrusion, and injection molding. Extrusion and injection molding are preferred.

In the semiconducting component for an electrographic device of the present invention, the crosslinked body has a hardness of preferably from 10 to 80, more preferably from 20 to 70 in a hardness test according to type A in JIS K6253.

In the semiconducting component for an electrographic device of the present invention, the crosslinked body has a volume resistivity of preferably from $1.0 \times 10^6$ to $1.0 \times 10^{10}$ Ω·cm, more preferably from $1.0 \times 10^6$ to $1.0 \times 10^9$ Ω·cm at 23° C. and 50% RH (relative humidity), the volume resistivity being measured according to JIS K6271.

The semiconducting component for an electrographic device of the present invention may be formed by stacking the crosslinked body for the invention onto a substrate. The substrate is varied in accordance with the usage of the component, and may be, for example, a resin or a metal such as aluminum or iron. An intermediate layer may be laid between the substrate and the crosslinked body. A surface layer outside the crosslinked body may be located. The semiconducting component for an electrographic device of the present invention is used as a semiconducting roll and belt, or some other in an electrographic device such as a copying machine or a printer.

Hereinafter, the present invention will be more specifically described by way of working examples and a comparative example. The invention is not limited thereto.

Synthesis of Polymerization Catalyst

Into a three-necked flask equipped with a thermometer and a stirrer were charged 10.0 g of dibutyltin oxide and 23.4 g of tributyl phosphate. While stirred in a nitrogen gas flow, the resultant liquid was heated at 260° C. for 15 minutes to distill off the distilled product, so that a solid condensed substance as a remaining product was yielded. This condensed substance was used as a polymerization catalyst.

Example 1

The inside of an SUS reactor (equipped with a thermometer and a stirrer) having an internal volume of 20 L was purged with nitrogen, and thereinto were charged 7.2 g of the condensed substance catalyst, 4500 g of n-hexane having a water content of 10 ppm or less, 607 g of epichlorohydrin, 60% of amount 820 g of ethylene oxide, and 61 g of 3-glycidoxypropyltrimethoxysilane to cause the components to react at 35° C. for 20 hours. At 1.5 hours and 2.5 hours after the start of the reaction period, proportions of 25% and 15% of the amount 820 g of ethylene oxide were added thereto, respectively. The reaction solution was removed, and then the resultant was dried at 40° C. under a reduced pressure for 8 hours to yield a copolymer.

Example 2

The inside of an SUS reactor (equipped with a thermometer and a stirrer) having an internal volume of 20 L was purged with nitrogen, and thereinto were charged 7.2 g of the condensed substance catalyst, 4500 g of n-hexane having a water content of 10 ppm or less, 587 g of epichlorohydrin, 60% of amount 839 g of ethylene oxide, and 74 g of glycidyl methacrylate to cause the components to react at 35° C. for 20 hours. At 1.5 hours and 2.5 hours after the start of the reaction period, proportions of 25% and 15% of the amount 839 g of ethylene oxide were added thereto, respectively. The reaction solution was removed, and then the resultant was dried at 40° C. under a reduced pressure for 8 hours to yield a copolymer.

Comparative Example 1

The inside of an SUS reactor (equipped with a thermometer and a stirrer) having an internal volume of 20 L was purged with nitrogen, and thereinto were charged 7.2 g of the condensed substance catalyst, 4500 g of n-hexane having a water content of 10 ppm or less, 304 g of epichlorohydrin, 60% of amount 661 g of ethylene oxide, and 534 g of 3-glycidoxypropyltrimethoxysilane to cause the components to react at 35° C. for 20 hours. At 1.5 hours and 2.5 hours after the start of the reaction period, proportions of 25% and 15% of the amount 661 g of ethylene oxide were added thereto, respectively. The reaction solution was removed, and then the resultant was dried at 40° C. under a reduced pressure for 8 hours to yield a copolymer. However, the copolymer of Comparative Example 1 was largely lowered in viscosity to yield a pasty substance with high tackiness. Consequently, the copolymer was not easily taken out from the reactor. Thus, the copolymer failed in being evaluated as described below.

The copolymer composition of the copolymer yielded in Example 1 was gained through $^1$H-NMR analysis and the chlorine content therein. The copolymer composition of the copolymer yielded in Example 2 was gained through the chlorine content therein and the iodine value thereof.

The chlorine content was gained by a potentiometric titration according to JIS K7229. The potentiometric titration was performed using a potential difference measuring instrument, AT-420N (manufactured by Kyoto Electronics Manufacturing Co., Ltd.) having, as electrodes, composite electrodes C-878. From the resultant chlorine content, the molar fraction of structural units originating from epichlorohydrin was calculated out.

The iodine value was measured by a method according to JIS K6235. To a stopper-attached flask were added about 0.70 g of a sample and 80 mL of chloroform, and the resultant was heated to 40° C. to dissolve the sample. Thereafter, thereto were added 20 mL of a Wijs reagent and 10 mL of an aqueous solution of sodium acetate. The resultant was sufficiently shaken, and then allowed to stand still in a dark place for 20 minutes. Next, thereto was added 5 mL of a 20% aqueous solution of potassium iodide in water, and then the resultant was sufficiently shaken. Thereafter, an automatic titrating device having a platinum micro combination electrode (redox titration) was used to subject the sample system to a potentiometric titration, using a 0.1N aqueous solution of sodium thiosulfate in water. From the resultant iodine value, the molar fraction of structural units originating from glycidyl methacrylate was calculated out.

$^1$H-NMR analysis was used to calculate out the molar fraction of structural units originating from 3-glycidoxypropyltrimethoxysilane. A measuring machine used was JNM-GSX270 manufactured by JEOL Ltd.

The molar fraction of the structural units originating from the alkylene oxide was calculated out to totalize this molar fraction and the respective molar fractions of the structural units originating from the other units into 100% by mole.

An open roll was used to make the copolymer yielded in each of Examples 1 and 2 into the form of sheets, and the sheets were pressed and crosslinked at 170° C. for 15 minutes to yield crosslinked sheets.

Volume Resistivity

The condition of any one of the crosslinked sheets produced as described above was adjusted in an environment of 23° C. temperature and 50% RH, and then HIRESTA (manufactured by Mitsubishi Petrochemical Co., Ltd.) using double-ring electrodes was used to measure the volume resistivity after an application of a voltage of 10V for 1 minute.

Hardness

Any one of the crosslinked sheets produced as described above was used to make a hardness test according to type A of JIS K6253. In this way, the hardness was measured. The results are shown in Table 2.

Contaminating Property

Any one of the crosslinked sheets produced as described above was cut into a piece 2 centimeter square. A load of 5 g per square centimeter of the piece was applied to the piece to compress the piece onto a photosensitive body. This resultant was allowed to stand still in an environment of 40° C. temperature and 90% RH for one week. An adhering matter onto the photosensitive body was then checked, and an evaluation was made as described below. The results are shown in Table 2.

○: when the photosensitive body after the test was used to make a print, no contamination scar was printed in the resultant image.

x: when the photosensitive body after the test was used to make a print, contamination scars were printed in the image.

Table 1 shows the composition ratio of the copolymer obtained in each of Examples 1 to 2, and Comparative Example 1, and Table 2 shows the volume resistivity of the crosslinked sheet in which the copolymer of each of Examples 1 to 2 was crosslinked.

TABLE 1

| | Example 1 | Example 2 | Comparative Example 1 |
|---|---|---|---|
| Epichlorohydrin | 26 | 24 | Unmeasurable |
| Ethylene oxide | 73 | 74 | |
| 3-Glycidoxypropyltrimethoxysilane | 1 | | |
| Glycidyl methacrylate | | 2 | |

TABLE 2

| | Example 1 | Example 2 |
|---|---|---|
| 23° C. × 50% RH | $1.1 \times 10^8$ | $1.3 \times 10^8$ |
| Hardness | 36 | 29 |
| Contaminating property | ○ | ○ |

Example 1 was a semiconducting component for an electrographic device that had a crosslinked body of the copolymer made of 26% by mole of structural units (a) originating from epichlorohydrin, 73% by mole of structural units (b) originating from ethylene oxide, and 1% by mole of structural units (c) originating from 3-glycidoxypropyltrimethoxysilane. Example 2 was a semiconducting component for an electrographic device that had a crosslinked body of the copolymer made of 24% by mole of structural units (a) originating from epichlorohydrin, 74% by mole of structural units (b) originating from ethylene oxide, and 2% by mole of structural units (c) originating from glycidyl methacrylate. In Comparative Example 1, the polymerization was performed to set the proportion of structural units (c) originating from 3-glycidoxypropyltrimethoxysilane to 11% by mole; however, the copolymer was largely lowered in viscosity to yield a pasty substance with high tackiness. Consequently, the copolymer was not easily taken out from the reactor. Thus, the copolymer failed in being evaluated.

Moreover, as shown in Table 2, it is understood that the copolymer crosslinked bodies of Examples 1 to 2, which are semiconducting components for electrographic devices of the present invention, had respective volume resistivities of $1.1 \times 10^8$ and $1.3 \times 10^8$ at 23° C. and 50% RH to keep semiconductivity; and further each had hardness suitable as an elastic material constituting a semiconducting component for an electrographic device, particularly, a semiconducting roll. Furthermore, the crosslinked bodies of the copolymers were each remarkably lowered in contaminating property to be usable favorably for a semiconducting component for an electrographic device.

INDUSTRIAL APPLICABILITY

The semiconducting component for an electrographic device of the present invention has semi-conductivity to be very useful for a semiconducting roll and belt in an electrographic device such as a copying machine or a printer.

The invention claimed is:

1. A semiconducting component for an electrographic device, comprising a crosslinked body obtained by crosslinking a copolymer containing 9.9 to 39.9% by mole of structural units (a) originating from an epihalohydrin, 60 to 90% by mole of structural units (b) originating from an alkylene oxide, and 0.1 to 10% by mole of structural units (c) originating from a cyclic ether monomer having a (meth)acryloyl or alkoxysilyl group with use of reactivity of the structural units originating from the cyclic ether monomer having a (meth)acryloyl or alkoxysilyl group, and wherein, taking the total proportion of the copolymer to be 100% by weight, the copolymer is crosslinked with less than 0.1% by weight of crosslinking agent.

2. The semiconducting component for an electrographic device according to claim 1, wherein the structural units (c) originating from the cyclic ether monomer having a (meth) acryloyl or alkoxysilyl group are each a structural unit originating from at least one selected from the group consisting of glycidyl acrylate, glycidyl methacrylate, 3-glycidoxypropyltrimethoxysilane, and 3-glycidoxypropylmethyldimethoxysilane.

3. The semiconducting component for an electrographic device according to claim 1, wherein the structural units (a) originating from the epihalohydrin are each a structural unit originating from at least one selected from the group consisting of epichlorohydrin and epibromohydrin.

4. The semiconducting component for an electrographic device according to claim 1, wherein the structural units (b) originating from the alkylene oxide are each a structural unit originating from at least one selected from the group consisting of ethylene oxide, propylene oxide and butylene oxide.

5. The semiconducting component for an electrographic device according to claim 1, wherein the crosslinked body has a hardness of 10 to 80 in a hardness test according to type A in JIS K 6253-3:2012.

6. The semiconducting component for an electrographic device according to claim 1, which is a semiconducting roll in which the crosslinked body is stacked on a substrate, the crosslinked body being a crosslinked body obtained by crosslinking the copolymer containing 9.9 to 39.9 by mole of the structural units (a) originating from the epihalohydrin, 60 to 90% by mole of the structural units (b) originating from the alkylene oxide, and 0.1 to 10% by mole of the structural units (c) originating from the cyclic ether monomer having a (meth)acryloyl or alkoxysilyl group with the use of the reactivity of the structural units originating from the cyclic ether monomer having a (meth)acryloyl or alkoxysilyl group.

7. An electrographic device comprising the semiconducting component for an electrographic device according to claim 1.

8. The semiconducting component for an electrographic device according to claim 1, wherein the crosslinked body does not comprise crosslinking agent.

9. The semiconducting component for an electrographic device according to claim 1, wherein the copolymer contains 9.9% to 34.5% by mole of the structural units (a).

10. The semiconducting component for an electrographic device according to claim 1, wherein the copolymer contains 9.9% to 29.5% by mole of the structural units (a).

11. The semiconducting component for an electrographic device according to claim 1, wherein the copolymer contains 60% to 80% by mole of the structural units (b).

12. The semiconducting component for an electrographic device according to claim 1, wherein the copolymer contains 65% to 80% by mole of the structural units (b).

13. The semiconducting component for an electrographic device according to claim 1, wherein the copolymer contains 1% to 8% by mole of the structural units (c).

14. The semiconducting component for an electrographic device according to claim 1, wherein the structural units (a) originate from epichlorohydrin.

15. The semiconducting component for an electrographic device according to claim 1, wherein the structural units (b) originate from ethylene oxide.

16. The semiconducting component for an electrographic device according to claim 1, wherein the structural units (c) originate from at least one of glycidyl methacrylate and 3-glycidoxypropyltrimethoxysilane.

17. The semiconducting component for an electrographic device according to claim 1,
   wherein the structural units (a) originate from epichlorohydrin,
   wherein the structural units (b) originate from ethylene oxide,
   wherein the structural units (c) originate from at least one of glycidyl methacrylate and 3-glycidoxypropyltrimethoxysilane.

18. A semiconducting component for an electrographic device, comprising a crosslinked body obtained by crosslinking a copolymer containing 9.9 to 39.9% by mole of structural units (a) originating from an epihalohydrin, 60 to 90% by mole of structural units (b) originating from an alkylene oxide, and 0.1 to 10% by mole of structural units (c) originating from a cyclic ether monomer having a (meth)acryloyl or alkoxysilyl group with use of reactivity of the structural units originating from the cyclic ether monomer having a (meth)acryloyl or alkoxysilyl group, and wherein the copolymer is crosslinked without crosslinking agent.

* * * * *